(12) United States Patent
Abhari et al.

(10) Patent No.: US 8,723,147 B2
(45) Date of Patent: May 13, 2014

(54) EXTREME ULTRAVIOLET LIGHT SOURCE WITH A DEBRIS-MITIGATED AND COOLED COLLECTOR OPTICS

(75) Inventors: Reza Abhari, Forch (CH); Andrea Giovannini, Lugano (CH); Bob Rollinger, Zürich (CH); Davide Bleiner, Zürich (CH)

(73) Assignee: ETH Zürich, Zürich (CH)

( * ) Notice: Subject to any disclaimer, the term of this patent is extended or adjusted under 35 U.S.C. 154(b) by 0 days.

(21) Appl. No.: 13/262,184

(22) PCT Filed: Mar. 25, 2010

(86) PCT No.: PCT/EP2010/001874
§ 371 (c)(1),
(2), (4) Date: Sep. 29, 2011

(87) PCT Pub. No.: WO2010/112171
PCT Pub. Date: Oct. 7, 2010

(65) Prior Publication Data
US 2012/0025109 A1    Feb. 2, 2012

(30) Foreign Application Priority Data
Apr. 2, 2009 (EP) .................................... 09004867

(51) Int. Cl.
*H05G 2/00* (2006.01)
*G21K 5/00* (2006.01)

(52) U.S. Cl.
USPC .................................. 250/504 R; 250/503.1

(58) Field of Classification Search
USPC ............ 250/493.1, 503.1, 504 R; 315/111.21
See application file for complete search history.

(56) References Cited

U.S. PATENT DOCUMENTS

| 3,969,824 A * | 7/1976 | Widen et al. .................... 433/30 |
| 2004/0165161 A1* | 8/2004 | Hara ................................. 355/30 |
| 2004/0179182 A1* | 9/2004 | Bakker ........................... 355/69 |
| 2006/0227826 A1* | 10/2006 | Balogh et al. .................. 372/34 |
| 2006/0243927 A1* | 11/2006 | Tran et al. ................. 250/504 R |
| 2008/0267816 A1* | 10/2008 | Ueno et al. ...................... 422/24 |

FOREIGN PATENT DOCUMENTS

| WO | WO 03/026363 A1 | 3/2003 |
| WO | WO 2004/104707 A2 | 12/2004 |
| WO | WO 2008/105989 A2 | 9/2008 |
| WO | WO 2008105989 A2 * | 9/2008 |
| WO | WO 2009/025557 A1 | 2/2009 |
| WO | WO 2009025557 A1 * | 2/2009 |

\* cited by examiner

*Primary Examiner* — Michael Logie
*Assistant Examiner* — David E Smith
(74) *Attorney, Agent, or Firm* — Pauley Petersen & Erickson

(57) ABSTRACT

The extreme ultraviolet light source comprises a production site capable of producing extreme ultraviolet radiation in a laser-produced plasma (3), and a collector optics (6) for collimating the extreme ultraviolet radiation. A pressurized influx of gas forms a gas curtain between the production site and the collector optics (6) in order to protect the collector optics (6) from debris (4) generated at the production site. The gas influx is directed in a way that it follows the surface of the collector optics (6). By thus shielding the collector optics (6) from the debris (4) its lifetime is enhanced. The shielding gas can further be used for cooling the collector optics (6).

16 Claims, 4 Drawing Sheets

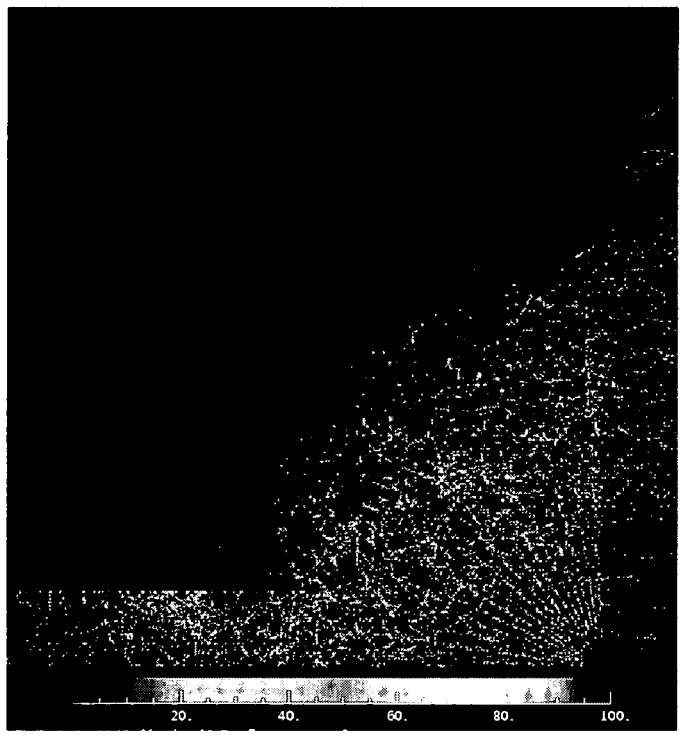
*Fig.5*
*Fig.6*
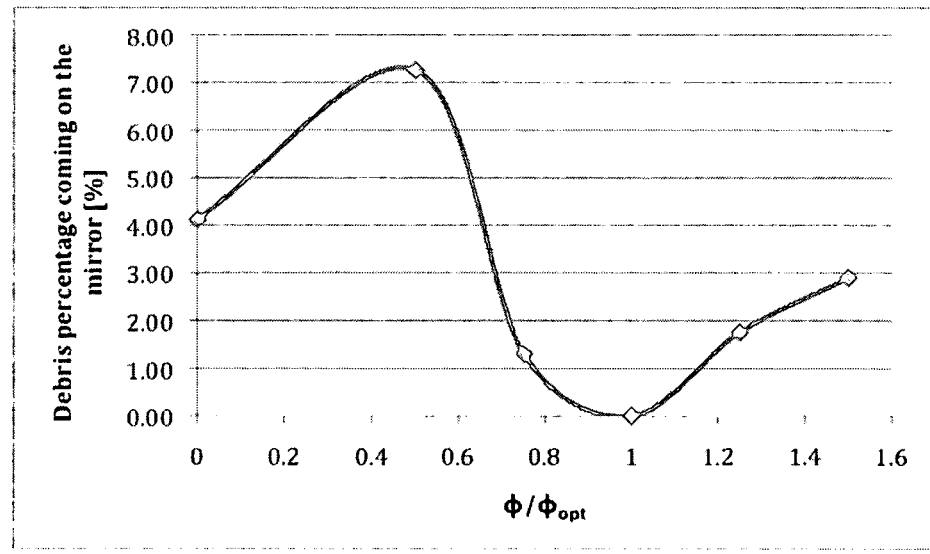

EXTREME ULTRAVIOLET LIGHT SOURCE WITH A DEBRIS-MITIGATED AND COOLED COLLECTOR OPTICS

BACKGROUND OF THE INVENTION

1. Field of the Invention

The present invention lies in the field of the generation of extreme ultraviolet (EUV) radiation. It refers to an extreme ultraviolet light source according to the preamble of claim 1.

2. Discussion of Related Art

The next generation of semiconductor devices will be manufactured using extreme ultraviolet (EUV) lithography. EUV light is electromagnetic radiation with wavelengths between 120 nm and 10 nm. In EUV sources, a EUV-emitting plasma is produced by irradiating a target material, e.g., tin (Sn). The radiation exciting the target material can be a laser beam, thus producing a laser produced plasma (LPP). The EUV radiation is collected by collector optics, e.g., a collimating mirror, and directed to an intermediate region for utilization outside of the EUV light source.

The debris produced by the EUV emitting laser plasma limits the lifetime of the collector optics and should be mitigated in order to assure high volume manufacturing. Debris particles are dangerous, because they have a high kinetic energy and thereby cause erosion of the collector optics. Two kinds of debris can be identified: ions and neutrals. The former are the most dangerous for the collector, because they are energetic (1 to 10 keV) and charged, promoting chemical reaction when hitting surfaces. However, the ions can be deflected through an electric field (F. Alfieri, Optimization study and design of a laser plasma debris-free EUV collector module, Master Thesis, ETH, 2008). On the other hand, neutrals have a lower kinetic energy (<1 eV) and are less reactive, but are more difficult to mitigate. Another important challenge that regards the optics in the EUV source facilities is the thermal management of the collector, since the shape of the collector, hence the light focalization, is influenced by the thermal expansion.

WO-2008/105989 A2 discloses an LPP EUV light source. The light source comprises a chamber into which droplets of a material that is capable of radiating extreme ultraviolet light when excited into a higher energy state are delivered. The droplets are irradiated by light pulses generated by a laser, thus producing a plasma and generating EUV emission. The light source further comprises a collector optics for collimating the EUV light in an intermediate region for further use. WO-2008/105989 A2 suggests disposing a flowing gas between the plasma and the optics. The gas should establish a gas pressure sufficient to operate over the distance between the plasma and the optics to reduce ion energy to a target maximum energy level before the ions reach the optics. The gas is delivered into the chamber by a regulated gas source, flows through the chamber and is removed from the chamber by an adjustable pump.

WO-03/026363 A1 teaches to prevent debris accumulation on the optics by means of a gas curtain. A gas curtain device projects a stream of gas over the path of the EUV light to deflect debris particles into a direction that is different from that of the path of the light.

WO-2009/025557 discloses a module for producing extreme ultraviolet radiation including a supply configured to supply droplets of an ignition material to a predetermined target ignition position and a laser arranged to be focused on the predetermined target ignition position and to produce a plasma by hitting such a droplet which is located at the predetermined target ignition position in order to change the droplet into an extreme ultraviolet producing plasma. Also, the module includes a chamber including a collector mirror that includes a mirror surface constructed and arranged to reflect the radiation in order to focus the radiation on a focal point FP and a fluid supply constructed to form a gas flow flowing away from the mirror surface in a direction transverse with respect to the mirror surface in order to mitigate particle debris produced by the plasma. The particle debris mitigation preferably occurs using the Peclet effect. The so-called Peclet number describes the rate of advection of a flow to its rate of diffusion, often thermal diffusion. It is equivalent to the product of the Reynolds number and the Prandtl number in the case of thermal diffusion, and the product of the Reynolds number and the Schmidt number in the case of mass dispersion. By creating a flow such that its advection is sufficiently high, the Peclet number will become so high, that the particle debris reaching the collector mirror will be sufficiently low. However, a disadvantage of this solution is the massive gas flow into the interior of the chamber, where the collected EUV radiation passes.

SUMMARY OF THE INVENTION

It is an object of this invention to effectively shield the collector optics from the debris (ions and neutrals), thus enhancing its lifetime. It is a further object of the invention to cool the collector optics. At the same time, the chain of droplets should be affected as little as possible, and the EUV radiation and its transmission should not be significantly influenced. These and other objects are achieved by the present invention as defined in the first claim. Preferred embodiments of the invention are defined in the dependent claims.

According to the invention, the extreme ultraviolet light source comprises a production site capable of producing extreme ultraviolet radiation, a collector optics for collimating the extreme ultraviolet radiation produced at the production site, and a pressurized influx of gas that forms a gas curtain between the production site and the collector optics in order to protect the collector optics from debris generated at the production site, whereby the gas influx is directed in a way that it follows the surface of the collector optics.

The collector is shielded by a gas curtain that follows the surface of the collector optics. Its goal is to deflect the debris by collisions, hence with momentum exchange. In this way, both ions and neutrals are deflected. The frequency of collisions depends on the density of the flow, and the momentum exchange depends on the velocity and on the mass of the particles. Therefore, the gas curtain should have a large number density, high velocity and massive atoms. On the other hand the density is chosen such that the absorption of EUV radiation and the possible disturbances to the droplet during fall are avoided as much as possible.

In order to investigate the gas curtain concept, simulations were made using DS2V. DS2V is a fully validated program developed by G. A. Bird. The program implements the direct simulation Monte Carlo (DSMC) method. A common computational fluid dynamics (CFD) code solving the Navier-Stokes equations cannot be used, because a rarefied flow has to be simulated, where the Kn number is of order unity or higher, i.e., the continuum assumption is not valid.

The DSMC method is widely used for the modeling of gas flows through the computation of the motion and collisions of thousands or millions of representative molecules (most applications of Monte Carlo simulation have been in the context of rarefied gas dynamics). With the performed simulations the working principle of the gas curtain has been tested, and the effectiveness has been demonstrated. The influence of different parameters has been studied, such as velocity injector thickness, number density, swirling angle, inlet velocity profile. Each simulation has been post processed, in order to find the percentage of the debris that arrive at the mirror, and the EUV radiation absorption due to the presence of the gas curtain gas along the path intermediate focus-mirror-focal point. The mitigation capability and the radiation absorption give a trade-off for the choice of the parameters to be applied to the gas curtain. However, the weight of the debris mitigation capability is much more important, since it determines the very expensive collector lifetime.

According to an embodiment of the invention the gas influx is realized by a plurality of axis-symmetric injection nozzles positioned around the outer border of the collector optics.

According to another embodiment of the invention the gas influx is realized by one axis-symmetric injection nozzle covering the whole outer border of the collector optics.

According to another embodiment of the invention the gas comprises a noble gas, preferably being selected from the group containing Hydrogen, Helium, Argon, Neon, Krypton, Xenon, Chlorine, Fluorine, Bromine, and Iodine.

According to another embodiment of the invention the gas influx speed is very high, and preferably significantly above the speed of the sound at the injection point.

According to another embodiment of the invention the gas is actively pumped out of the device through a vacuum applied at the center of the collector optics.

According to another embodiment of the invention the gas influx comprises an additional component that is tangent to the border of the collector optics so that a swirl is induced in the flow of the gas curtain.

According to another embodiment of the invention the tangential angle at the injection point relative to the radial line is between 0° and 45°.

According to another embodiment of the invention the gas curtain comprises at least two layers, wherein a first layer that is further away from the collector optics implies a higher velocity than a second layer closer to the surface of the collector optics, so that the second layer is not perturbed by the pressure conditions of the production site.

According to another embodiment of the invention the gas is used simultaneously as a coolant for the collector optics by conducting it along a back side of the collector optics before it reaches the injection point where it begins to protect the surface of the collector optics from deposition and erosion by debris, and is injected at the injection point with a maximum stagnation temperature of 700 K.

According to another embodiment of the invention the internal cooling is tailored to match the heat flux on the surface of the collector optics by controlling the mass flow of the gas on the back side of the collector optics.

According to another embodiment of the invention matching of the heat flux is achieved by a geometric arrangement of holes on the backside of the collector optics.

According to another embodiment of the invention matching of the heat flux is achieved by an arrangement of turbulators on the backside of the collector optics.

According to another preferred embodiment the fluid can be charged and/or ionized.

According to another embodiment of the invention the gas is injected with an exit static pressure of at least the pressure in the extreme ultraviolet light production site.

According to just another embodiment of the invention the fluid is further used to clean the surface of the collector optics.

According to another embodiment of the invention the collector optics comprise a collector mirror containing a hole in its center.

According to still another embodiment of the invention the gas influx is injected in parallel to the collector optics such that it has a radial component with respect to the outer border of the collector optics.

BRIEF DESCRIPTION OF THE DRAWINGS

The present invention is now to be explained more closely by means of different embodiments and with reference to the attached drawings.

FIG. 5 shows a CFD simulation of the debris in the EUV source according to the invention in a top view; and FIG. 6 shows a calculated percentage of debris hitting the mirror as a function of the swirling angle normalized with the optimal value.

DESCRIPTION OF PREFERRED EMBODIMENTS

Figure 1:
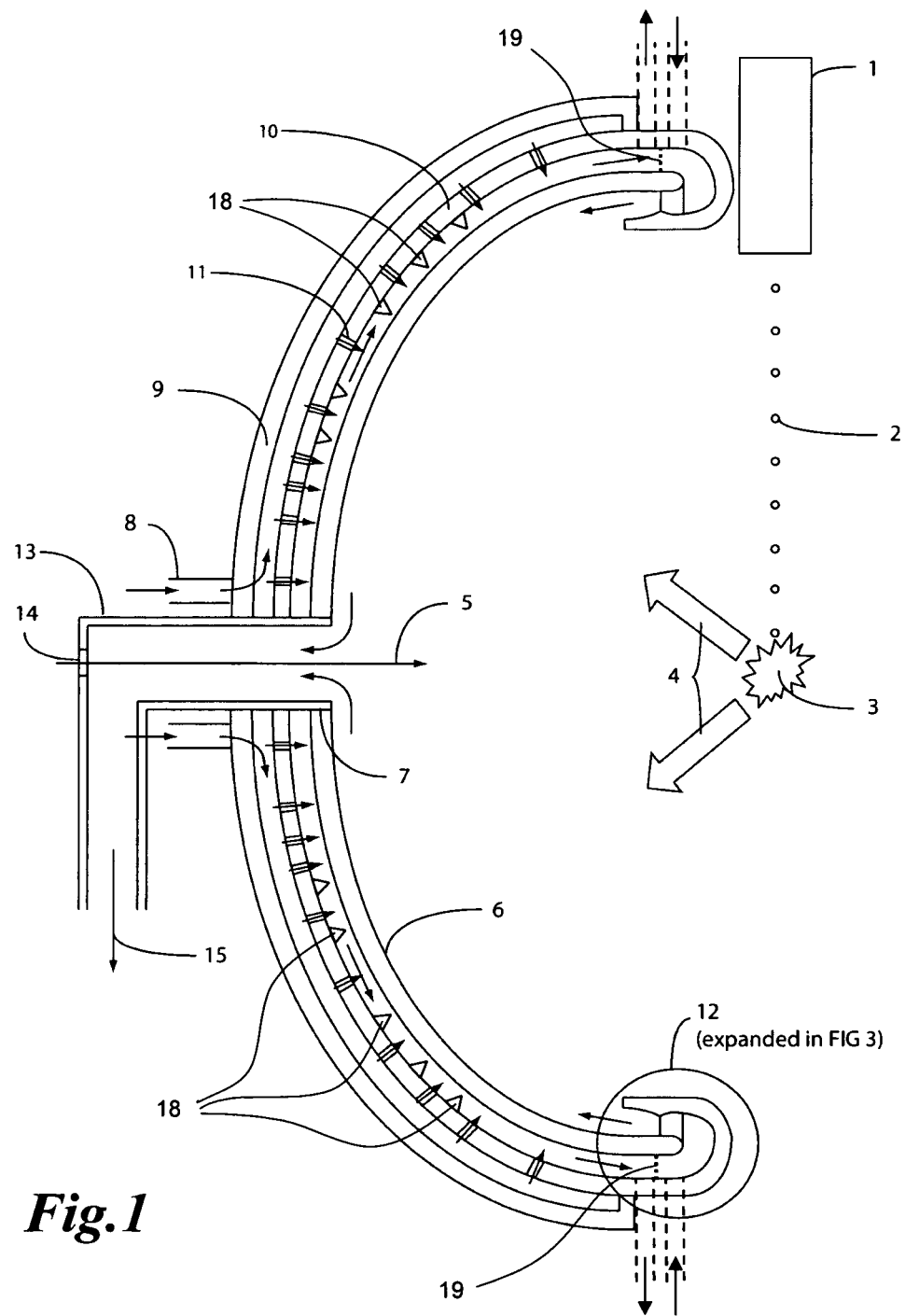
FIG. 1 schematically shows an LPP based EUV source according to the invention in a cross section.
Figure 2:
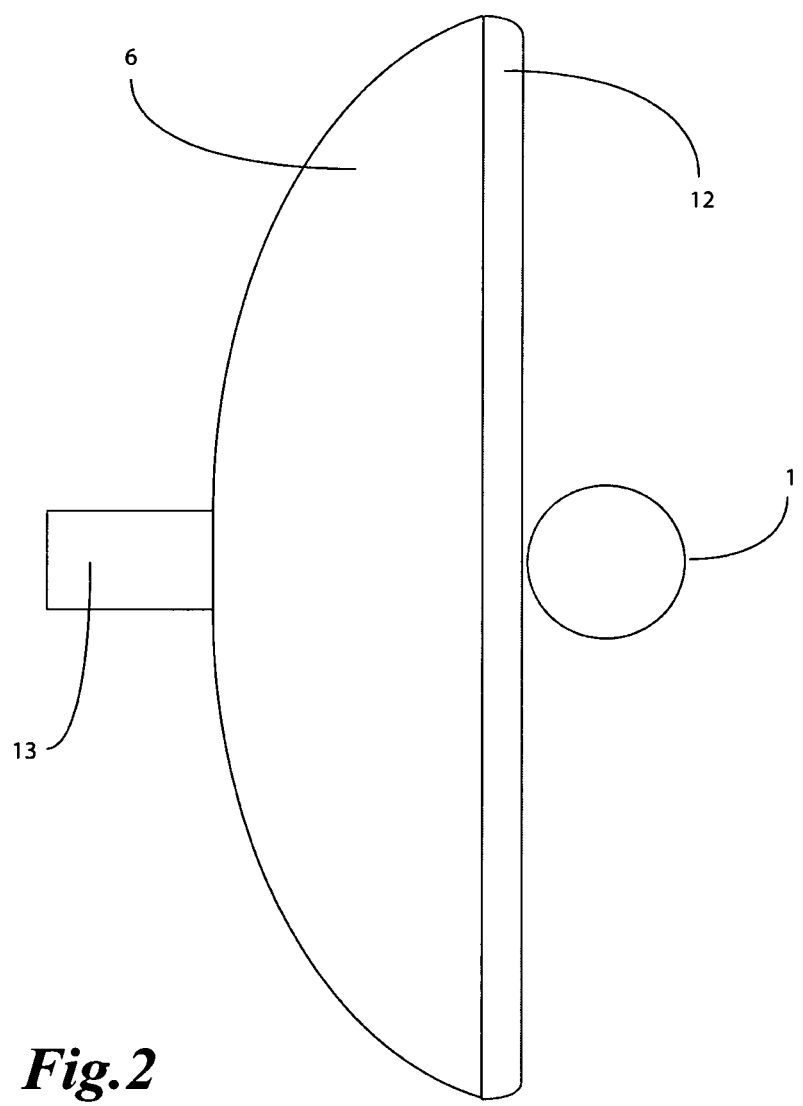
FIG. 2 shows parts of the EUV source according to the invention in a top view.

A preferred embodiment of the EUV source according to the invention is shown in FIG. 1. The elements shown should be sealed in a vacuum chamber, so that the EUV radiation absorption is limited. The EUV source comprises a mass limited target dispenser 1 aligned with a pulsed laser radiation 5. The mass limited targets 2, e.g., droplets, are irradiated by the laser radiation 5 in a EUV production region 3, where EUV light is produced by exciting the droplets 2. Together with the EUV radiation, debris 4 is generated and expands in the direction of a collector optics 6, e.g., a multi-layer mirror. The collector optics 6 is provided with a hole 7 in the middle 7 such that the pulsed laser radiation 5 can pass through.

The EUV source according to the invention is provided with a debris mitigation system and a cooling of the collector optics 6. A flow of a curtain fluid first passes the internal cooling system and cools the collector optics 6. Then the curtain fluid exits from an outer border of the collector optics 6, builds up a gas curtain that follows the surface of the collector optics 6, and is finally pumped out in the center of the collector optics 6.

In more detail, the curtain fluid is injected into the mirror 6 via injection openings 8 arranged close to the middle of the mirror 6. It passes through an internal cooling path 9 towards a curtain injector 12. The thermal management in vacuum is a critical issue because of the absence of convection. The injected gas cools the collector internally as it passes through the internal cooling path 9, and externally as it follows the surface of the collector optics 6. The heat flux on the collector 6 is not uniform. Therefore the internal cooling is tailored, i.e., the regions with bigger heat flux get more coolant mass flow. This is achieved by providing a cooling interface 10 in the internal cooling path 9. The cooling interface 10 is designed to have a plurality of through-holes 11 the density of which is matched to the heat flux on the surface of the collector 6.

Another way to shape the temperature distribution of the collector 6 is to provide inserts in the form of ribs or turbulators 18 (wedge shaped in this case), which are distributed on the inner surface of the cooling interface 10 at predetermined positions to accelerate and direct the cooling gas flow towards the back side of the collector 6. In the regions where these turbulators 18 are installed and act as barriers, the heat transfer from the back side of the collector 6 to the flow of the cooling gas is enhanced. Similar turbulators may also or alternatively be provided on the back side of the collector 6 itself.

Figure 3:
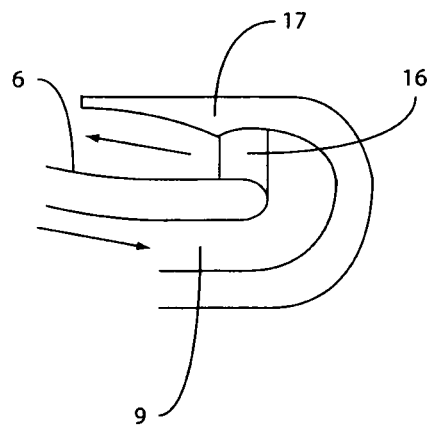
FIG. 3 shows an ejector of the gas curtain in the EUV source according to the invention in a cross section.

At the end of the internal cooling path 9, the curtain fluid enters a gas curtain injector 12, which is schematically shown in FIG. 3. A nozzle 17 of the gas curtain injector 12 is designed to have a convergent and a divergent part. The convergent part is connected to the internal cooling path 9, whereas the divergent part opens to the concave surface of the collector 6. The nozzle 17 allows achieving supersonic flow velocity, and it is axisymmetric covering the whole outer border of the collector 6. Nozzle swirlers 16 arranged between the convergent and the divergent part of the nozzle 17 give the tangential (with respect to the collector border) velocity component to the flow and mechanically stabilize the nozzle 17.

However, the internal cooling and gas curtain systems need not necessarily be coupled, as described above. According to another embodiment of the invention the debris mitigation (gas curtain) may separated from the cooling system, which is independent, preferably in a closed loop, and manages the collector heating. In this case, a separation means 19 (dashed line in FIG. 1) is provided to separate the gas curtain and cooling flows. The outlet of the cooling flow and the inlet of the gas curtain flow are shown in FIG. 1 with dashed lines. Each of the separated systems may have a separate temperature and gas flow control.

Figure 4:
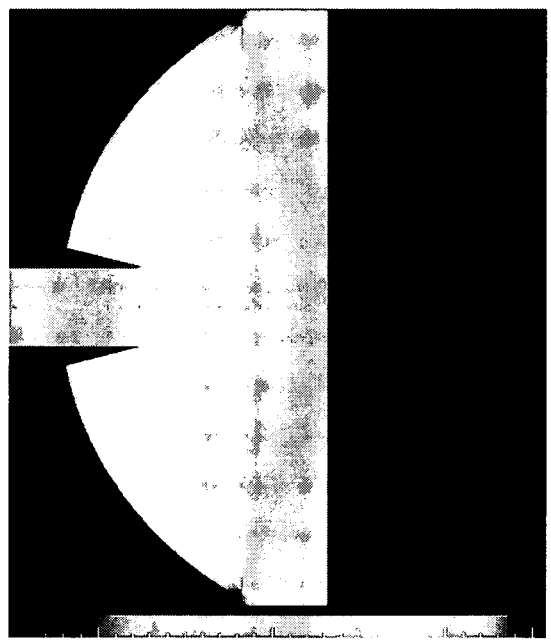
FIG. 4 shows a CFD simulation of the gas curtain density in the EUV source according to the invention in a top view.

The simulation of FIG. 4 shows that the flow ejected by the nozzle 17 remains attached to the collector optics 6 up to the fluid exit passage 13. In the representation of FIG. 4, the bright area along the collector optics 6 indicates a high flow velocity and consequently, the formation of a gas curtain as desired.

The simulation of FIG. 5 demonstrates that the gas curtain successfully deflects debris. In the representation of FIG. 5, showing only one half of the EUV source, the white lines denote paths of debris in the form of tin droplets produced in the lower right-hand corner. The dark areas are free of debris. In this simulation, the gas curtain has an effectiveness of 100%, thus completely mitigating the debris. The debris is deflected by the gas curtain and does not reach the collector optics 6.

The gas can be switched, in order to pass from a collector-optics-shielding mode to a collector-optics-cleaning mode or vice versa, or the two effects can be coupled. In the case of coupled effects, the fluid used for the gas curtain is mixed, in order to have debris mitigation and cleaning effect at the same time. The gas can be ionized.

The diffusion of the gas curtain in the vacuum chamber is limited if the gas layer remains attached to the surface of the collector optics 6, and the effectiveness is increased with flow velocity. Introducing a swirl at the nozzle 17 (cf. FIG. 3, swirler 16) permits to achieve the two goals also near the middle of the collector optics 6.

FIG. 6 shows the debris impinging on the collector optics 6 as a function of the normalized swirling angle. The normalization is made using the value of the swirl angle (i.e., the angle between a radial line and the inlet velocity vector) that allows achieving the maximal debris mitigation. Depending on the strength of the swirl and on the flow rate of the vacuum pump, this region has different radial positions.

Consequently, the optimum swirl angle is a function of the dimension of the collector optics 6.

The injected gas can be chosen from a variety of different gases, in neutral or ionic state, including: Hydrogen, Helium, Argon, Neon, Krypton, Nitrogen, Xenon, Chlorine, Fluorine, Bromine, and Iodine; or a mixture of the listed gases.

The invention claimed is:

1. An extreme ultraviolet light source comprising:
    a production site producing extreme ultraviolet radiation;
    a collector optics (6) for collimating the extreme ultraviolet radiation produced at the production site;
    a vacuum applied at a center of the collector optics (6) that actively pumps out of the device; and
    a pressurized influx of gas that forms a gas curtain between the production site and the collector optics (6) to protect the collector optics (6) from debris (4) generated at the production site, wherein the gas influx is directed in a way that it follows the surface of the collector optics (6), wherein the gas is used simultaneously as a coolant for the collector optics (6) by conducting it along a back side of the collector optics (6) before it reaches an injection point (12) where it begins to protect the surface of the collector optics (6) from deposition and erosion by debris, and is injected at the injection point (12) with a maximum stagnation temperature of 700 K, and
    wherein internal cooling is tailored to match heat flux on the surface of the collector optics (6) by controlling the mass flow of the gas on the back side of the collector optics (6) with an arrangement of turbulators (18).

2. An extreme ultraviolet light source according to claim 1, further comprising a plurality of axis-symmetric injection nozzles (17) positioned around the outer border of the collector optics (6) to produce the gas influx.

3. An extreme ultraviolet light source according to claim 1, further comprising one axis-symmetric injection nozzle (17) covering the whole outer border of the collector optics (6) to produce the gas influx.

4. An extreme ultraviolet light source according to claim 1, wherein the gas comprises a noble gas selected from the group containing Hydrogen, Helium, Argon, Neon, Krypton, Xenon, Nitrogen, Chlorine, Fluorine, Bromine, and Iodine.

5. An extreme ultraviolet light source according to claim 1, wherein the gas influx speed is very high, and preferably significantly above the speed of the sound at an injection point (12).

6. An extreme ultraviolet light source comprising:
    a production site producing extreme ultraviolet radiation;
    a collector optics (6) for collimating the extreme ultraviolet radiation produced at the production site; and
    a pressurized influx of gas that forms a gas curtain between the production site and the collector optics (6) to protect the collector optics (6) from debris (4) generated at the production site, wherein the gas influx is directed in a way that it follows the surface of the collector optics (6), wherein the gas is used simultaneously as a coolant for the collector optics (6) by conducting it along a back side of the collector optics (6) before it reaches an injection point (12) where it begins to protect the surface of the collector optics (6) from deposition and erosion by debris, and is injected at the injection point (12) with a maximum stagnation temperature of 700 K, and further wherein internal cooling is tailored to match heat flux on the surface of the collector optics (6) by controlling the mass flow of the gas on the back side of the collector optics (6) and wherein matching of the heat flux is achieved by an arrangement of turbulators (18) on the backside of the collector optics (6).

7. An extreme ultraviolet light source according to claim 1, wherein the gas influx further comprises an additional component that is tangent to the border of the collector optics (6) so that a swirl is induced in the flow of the gas curtain.

8. An extreme ultraviolet light source according to claim 7, wherein a tangential angle at an injection point (12) relative to the radial line is between 0° and 45°.

9. An extreme ultraviolet light source according to claim 1, wherein matching of the heat flux is achieved by a geometric arrangement of holes (10) on the backside of the collector optics (6).

10. An extreme ultraviolet light source according to claim 1, wherein the gas is injected with an exit static pressure of at least the pressure in the extreme ultraviolet light production site.

11. An extreme ultraviolet light source according to claim 1, wherein the gas is further used to clean the surface of the collector optics (6).

12. An extreme ultraviolet light source according to claim 11, wherein the gas is ionized.

13. An extreme ultraviolet light source according to claim 1, wherein the collector optics (6) comprises a collector mirror containing a hole (7) in its center.

14. An extreme ultraviolet light source according to claim 1, wherein the gas influx is injected in parallel to the collector optics (6) such that it has a radial component with respect to the outer border of the collector optics (6).

15. An extreme ultraviolet light source according to claim 1, further comprising a separate (19), closed-loop, collector cooling system (8, 9, 10, 11).

16. An extreme ultraviolet light source according to claim 6, further comprising a vacuum applied at the center of the collector optics (6) that actively pumps out of the device.

* * * * *